(12) United States Patent
Takase et al.

(10) Patent No.: US 8,072,831 B2
(45) Date of Patent: Dec. 6, 2011

(54) FUSE ELEMENT READING CIRCUIT

(75) Inventors: Rikio Takase, Kawasaki (JP); Masahiro Sueda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 98 days.

(21) Appl. No.: 12/501,877

(22) Filed: Jul. 13, 2009

(65) Prior Publication Data

US 2010/0014374 A1 Jan. 21, 2010

(30) Foreign Application Priority Data

Jul. 15, 2008 (JP) .................. 2008-184315

(51) Int. Cl.
*G11C 17/18* (2006.01)
*G11C 7/02* (2006.01)
*G11C 17/00* (2006.01)

(52) U.S. Cl. .............. 365/225.7; 365/210.14; 365/96; 365/210.15

(58) Field of Classification Search .............. 365/96, 365/210.1, 210.14, 225.7; 324/550
See application file for complete search history.

(56) References Cited

U.S. PATENT DOCUMENTS

| 6,903,986 | B2 * | 6/2005 | Hejdeman et al. | 365/201 |
| 7,030,641 | B1 * | 4/2006 | Tang et al. | 324/550 |
| 7,307,864 | B2 | 12/2007 | Kohara | |
| 2005/0151578 | A1 * | 7/2005 | Huang et al. | 327/525 |
| 2007/0278615 | A1 | 12/2007 | Kushiyama | |
| 2009/0009186 | A1 * | 1/2009 | Kaneko | 324/550 |

* cited by examiner

*Primary Examiner* — VanThu Nguyen
*Assistant Examiner* — Khamdan Alrobaie
(74) *Attorney, Agent, or Firm* — Arent Fox LLP

(57) ABSTRACT

A fuse element reading circuit including a first fuse element having a resistance which differs in accordance with whether the first fuse element is in a blown state or an unblown state, a reference voltage output circuit unit that outputs a reference voltage that differs in accordance with a normal mode or a test mode, and a voltage comparison circuit unit that compares a read voltage corresponding to the resistance of the first fuse element with the reference voltage output from the reference voltage output circuit unit.

6 Claims, 8 Drawing Sheets

FUSE ELEMENT READING CIRCUIT

CROSS REFERENCES TO RELATED APPLICATIONS

This application is based upon and claims the benefit of priority from the prior Japanese Patent Application No. 2008-184315 filed on Jul. 15, 2008, the entire contents of which are incorporated herein by reference.

FIELD

Aspects of the present invention relate to a fuse element reading circuit.

BACKGROUND

FIG. 2 illustrates an example of a configuration of a fuse element reading circuit. FIG. 3 illustrates the resistances and frequencies of electric fuse elements. An electric fuse element 211 has a resistance that differs in accordance with whether the electric fuse element 211 is in a blown state or an unblown state. The electric fuse element 211 in the unblown state has a small resistance, whereas the electric fuse element 211 in the blown state has a large resistance. In FIG. 3, a frequency distribution 301 represents the frequency of the electric fuse element 211 in the unblown state, and a frequency distribution 302 represents the frequency of the electric fuse element 211 in the blown state.

At the time of reading, a control node SEN is at a high level, and a read voltage output circuit unit 201 outputs a read voltage V1 corresponding to the resistance of the electric fuse element 211. The read voltage V1 is low when the electric fuse element 211 is in the unblown state, whereas the read voltage V1 is high when the electric fuse element 211 is in the blown state. A reference voltage output circuit unit 204 outputs a reference voltage V3 by resistance division.

A selection circuit unit 202 selects one of read voltages V1 of a plurality of read voltage output circuit units 201, and outputs the selected read voltage V1 as a read voltage V2. A voltage comparison circuit unit 203 compares the read voltage V2 with the reference voltage V3, and outputs a voltage V4, which represents a comparison result. A latch circuit unit 205 latches the voltage V4, and outputs a voltage OUT.

The electric fuse element 211 is capable of storing data in accordance with whether the electric fuse element 211 is in the blown state or the unblown state. If the resistance of the electric fuse element 211 is smaller than a threshold resistance 303 (see FIG. 3), it is determined that the electric fuse element 211 is in the unblown state. Meanwhile, if the resistance of the electric fuse element 211 is greater than the threshold resistance 303, it is determined that the electric fuse element 211 is in the blown state. The read voltage V2 is a voltage corresponding to the resistance of the electric fuse element 211. The reference voltage V3 is a voltage corresponding to the threshold resistance 303. If the read voltage V2 is lower than the reference voltage V3, the voltage comparison circuit unit 203 determines that the electric fuse element 211 is in the unblown state. Meanwhile, if the read voltage V2 is higher than the reference voltage V3, the voltage comparison circuit unit 203 determines that the electric fuse element 211 is in the blown state.

As described above, it is necessary for the electric fuse element 211 in the unblown state to have a resistance smaller than the threshold resistance 303, and it is necessary for the electric fuse element 211 in the blown state to have a resistance greater than the threshold resistance 303. To this end, a test for the resistance of the electric fuse element 211 is carried out. When the electric fuse element 211 is in the unblown state, if the read voltage V2 is lower than the reference voltage V3, the test is successful. When the electric fuse element 211 is in the blown state, if the read voltage V2 is higher than the reference voltage V3, the test is successful.

However, as depicted in FIG. 3, a variation in the resistance of the electric fuse element 211 may occur for various reasons. The electric fuse element 211 having a resistance within a region 304 or 305 passes the test. However, since the regions 304 and 305 are in the vicinity of the threshold resistance 303, erroneous determination may be made in the case of reading data of the electric fuse element 211. Namely, a sufficient reading margin is not ensured.

In addition, the semiconductor integrated circuit described below is described in Japanese Unexamined Patent Application Publication No. 2006-310457, the entirety of which is hereby incorporated by reference. The semiconductor integrated circuit includes a first fuse element, which stores data in accordance with a difference in resistance, depending on the presence or absence of electric writing, and from which data is read in accordance with the resistance when a voltage is applied across the ends of the first fuse element, and a second fuse element, which has a characteristic equivalent to that of the first fuse element and which is used for read trim control for determining a read condition relative to the first fuse element. The semiconductor integrated circuit further includes a trim value automatic control circuit unit, which reads data of the second fuse element by applying a constant voltage across the ends of the second fuse element before reading the data of the first fuse element, and which outputs a trim value specifying a desired read condition relative to the first fuse element in accordance with a read result, and a fuse data read circuit unit, which applies a constant voltage across the ends of the first fuse element at the time of reading the data of the first fuse element, and which reads the data in accordance with the trim value supplied from the read trim value automatic control circuit unit.

In addition, the resistance-change-type fuse circuit described below is described in Japanese Unexamined Patent Application Publication No. 2007-299926, the entirety of which is hereby incorporated by reference. The resistance-change-type fuse circuit includes a plurality of polysilicon fuses, which are made of polysilicon and which cause irreversible changes in resistance by causing a current to flow, a plurality of programming transistors, which are arranged in association with the plurality of fuses and which switch between causing and not causing currents to flow through the corresponding fuses, so as to cause changes in the resistance, and a dummy fuse group that includes a plurality of dummy fuses that have the same electric characteristic as that of the plurality of polysilicon fuses, and that have a resistance that is 1/n times the resistance of the plurality of polysilicon fuses. The resistance-change-type fuse circuit further includes a dummy transistor circuit unit that includes at least one dummy transistor that has a conductance that is 1/n times the conductance of the plurality of programming transistors, and that has a gate and drain connected to each other, and a current mirror circuit unit that includes the programming transistor and the dummy transistor, and that causes a current that is n times the current flowing in the dummy fuse group to flow in the plurality of polysilicon fuses.

SUMMARY

According to an aspect of the present invention a fuse element reading circuit includes a first fuse element having a resistance that differs in accordance with whether the first fuse element is in a blown state or an unblown state, a reference voltage output circuit unit that outputs a reference voltage that differs in accordance with a normal mode or a test mode, and a voltage comparison circuit unit that compares a read voltage corresponding to the resistance of the first fuse element with the reference voltage output from the reference voltage output circuit unit.

The features and advantages of the invention will be realized and attained by means of the elements and combinations particularly pointed out in the claims.

It is to be understood that both the foregoing general description and the following detailed description are exemplary and explanatory and are not restrictive of the invention, as claimed.

DETAILED DESCRIPTION

First Embodiment

Figure 1:
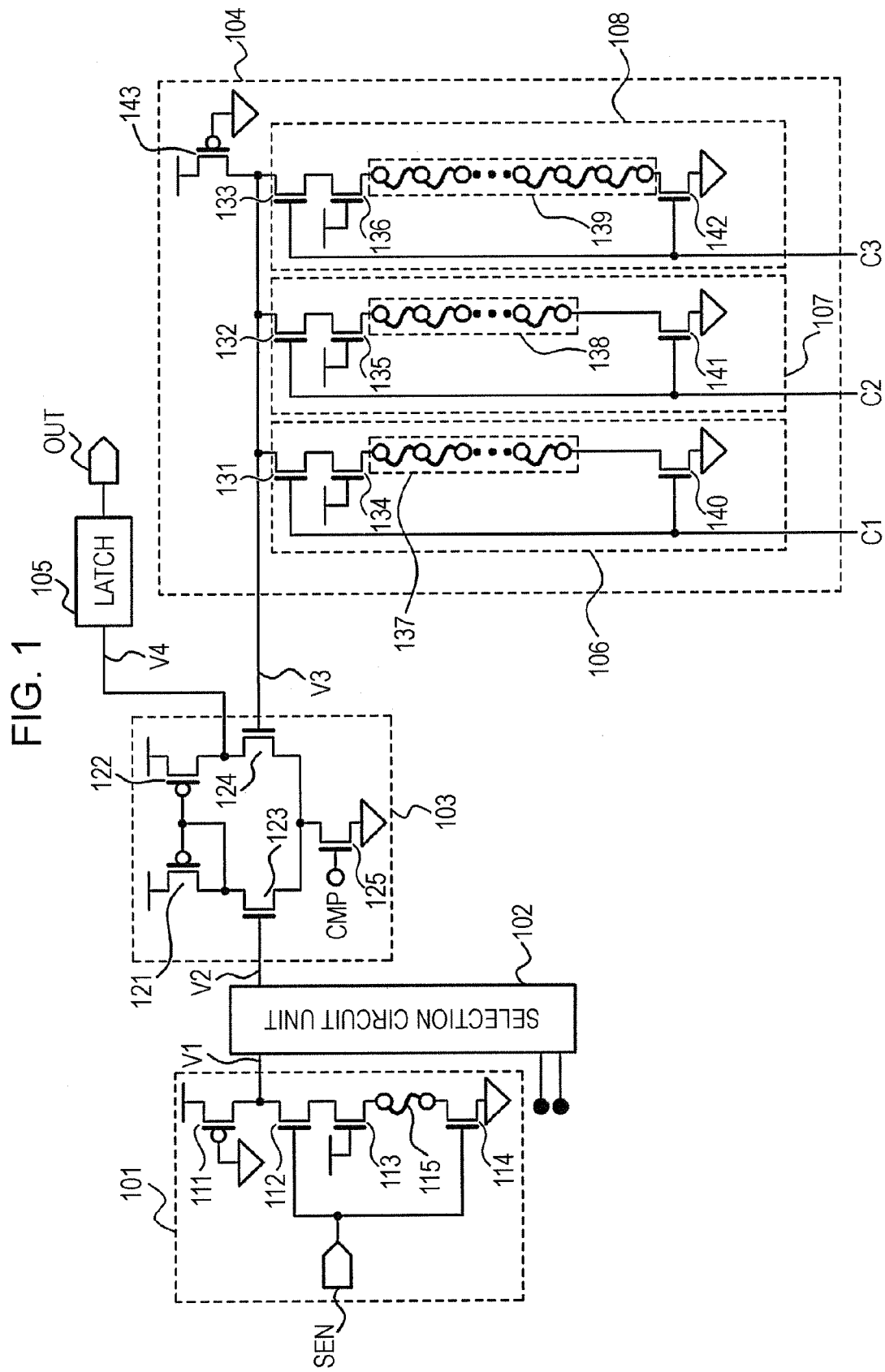
FIG. 1 illustrates an example of a fuse element reading circuit according to a first variation of the present invention.
Figure 2:
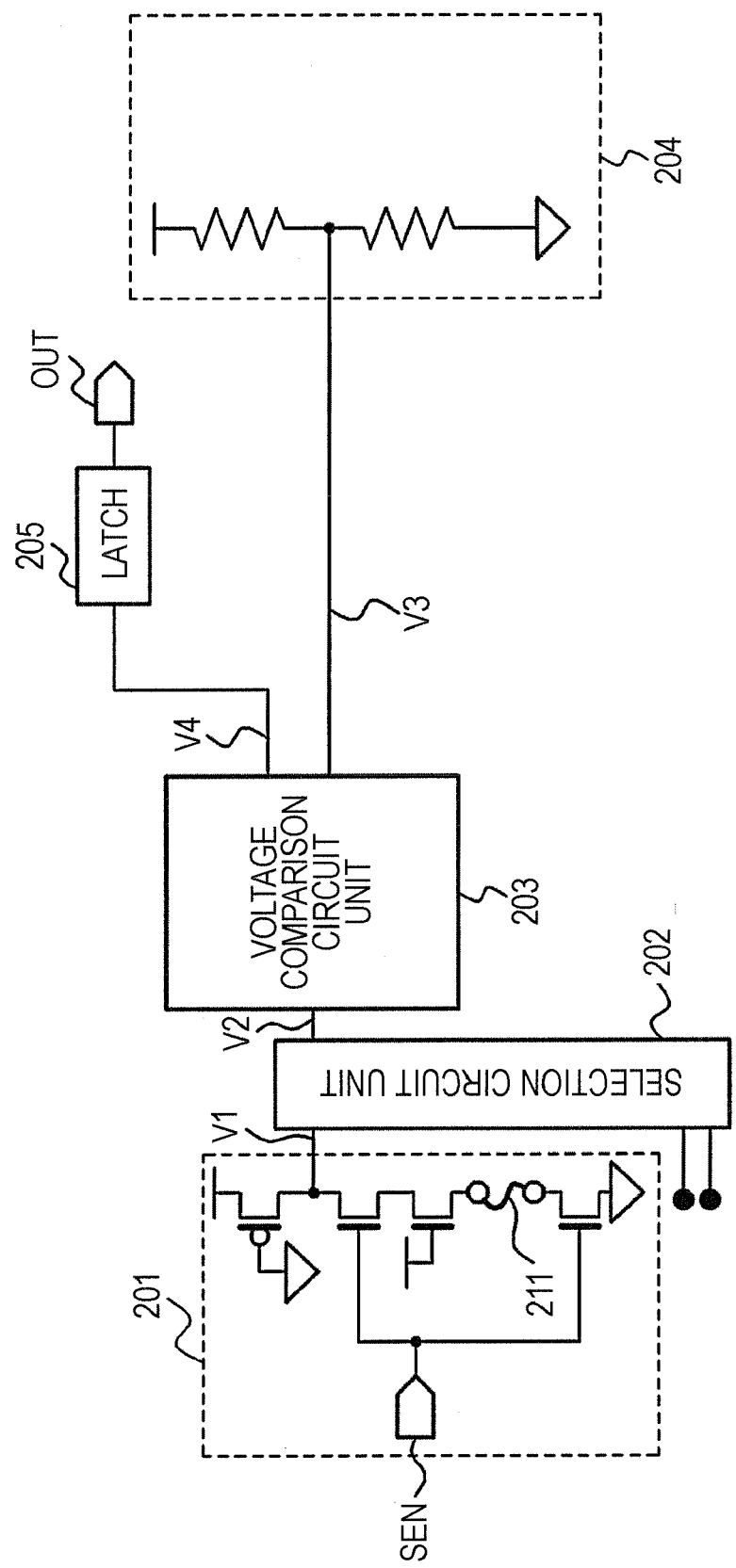
FIG. 2 illustrates an example of a fuse element reading circuit, in accordance with aspects of the present invention.
Figure 3:
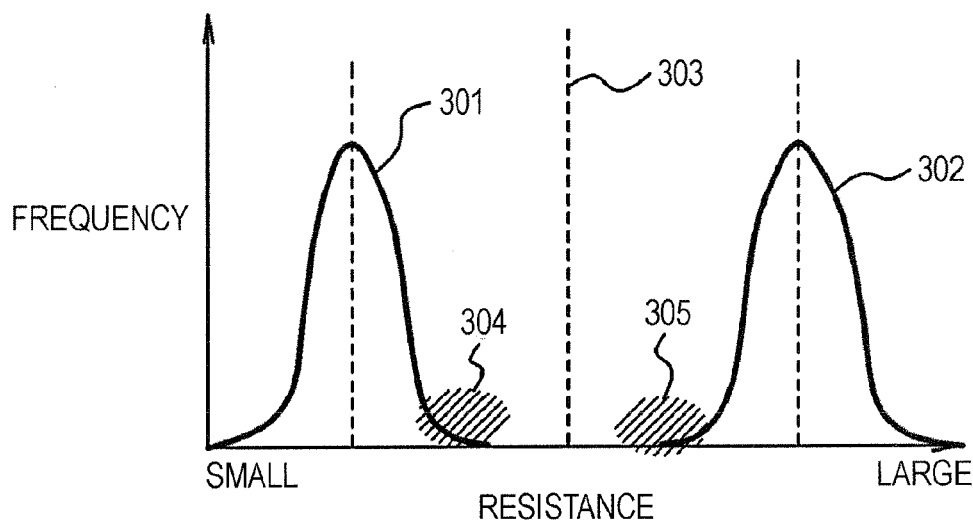
FIG. 3 is an illustration illustrating the resistances and frequencies of electric fuse elements, in accordance with aspects of the present invention.
Figure 4:
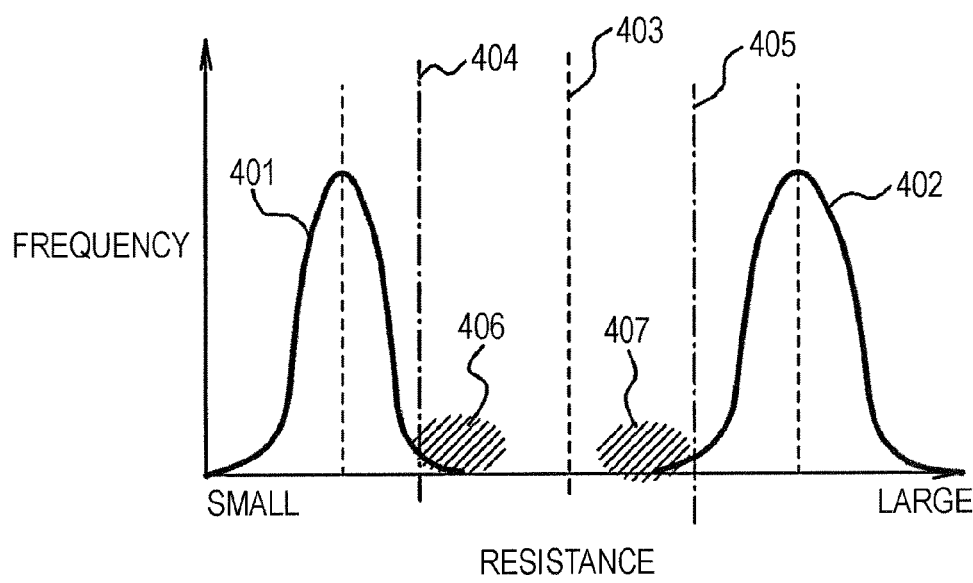
FIG. 4 is an illustration illustrating the resistances and frequencies of electric fuse elements, in accordance with aspects of the present invention.

FIG. 1 depicts an example of a fuse element reading circuit according to a first variation of the present invention. FIG. 4 is an illustration depicting the resistances and frequencies of electric fuse elements. The fuse element reading circuit includes a read voltage output circuit unit 101, a selection circuit unit 102, a voltage comparison circuit unit 103, a reference voltage output circuit unit 104, and a latch circuit unit 105.

The read voltage output circuit unit 101 includes field-effect transistors 111 to 114 and a first electric fuse element 115. Hereinafter, field-effect transistors will be simply referred to as transistors. The source of the transistor 111, which is a P-channel transistor, is connected to a power supply voltage node, the gate of the transistor 111 is connected to a reference potential node (ground potential node), and the drain of the transistor 111 is connected to an output node. The drain of the transistor 112, which is an N-channel transistor, is connected to the output node, and the gate of the transistor 112 is connected to a control node SEN. The drain of the transistor 113, which is an N-channel transistor, is connected to the source of the transistor 112, and the gate of the transistor 113 is connected to a power supply voltage node. The gate of the transistor 114, which is an N-channel transistor, is connected to the control node SEN, and the source of the transistor 114 is connected to a reference potential node. The first electric fuse element 115 is connected between the source of the transistor 113 and the drain of the transistor 114. A read voltage V1 is output from the output node, which is a connection point between the drains of the transistors 111 and 112.

The first electric fuse element 115 has a resistance that differs in accordance with whether the first electric fuse element 115 is in the blown state or the unblown state. The first electric fuse element 115 in the unblown state has a small resistance, such as 100Ω. Meanwhile, the first electric fuse element 115 in the blown state has a large resistance, such as 1000Ω. In FIG. 4, a frequency distribution 401 represents the frequency of resistances of the first electric fuse element 115 in the unblown state, and a frequency distribution 402 represents the frequency of resistances of the first electric fuse element 115 in the blown state.

At the time of reading, the control node SEN is at a high level, and the read voltage output circuit unit 101 outputs the read voltage V1 corresponding to the resistance of the first electric fuse element 115. The read voltage V1 is low when the first electric fuse element 115 is in the unblown state, whereas the read voltage V1 is high when the first electric fuse element 115 is in the blown state.

A normal mode signal C1, an unblown fuse element test mode signal C2, and a blown fuse element test mode signal C3 are input to the reference voltage output circuit unit 104. One of the normal mode signal C1, the unblown fuse element test mode signal C2, and the blown fuse element test mode signal C3 is at a high level, and the other two of the normal mode signal C1, the unblown fuse element test mode signal C2, and the blown fuse element test mode signal C3 are at a low level. The normal mode signal C1 is a signal indicating a normal mode in which normal use is achieved. The unblown fuse element test mode signal C2 is a signal indicating an unblown fuse element test mode in which a test for the resistance of the first electric fuse element 115 in the unblown state is carried out. The blown fuse element test mode signal C3 is a signal indicating a blown fuse element test mode in which a test for the resistance of the first electric fuse element 115 in the blown state is carried out.

The reference voltage output circuit unit 104 includes a first reference voltage output circuit section 106, a second reference voltage output circuit section 107, a third reference voltage output circuit section 108, and a P-channel transistor 143. The reference voltage output circuit unit 104 outputs different voltage values of a reference voltage V3, in accordance with the normal mode (signal C1), the unblown fuse element test mode (signal C2), and the blown fuse element test mode (signal C3). The source of the transistor 143 is connected to a power supply voltage node, the gate of the transistor 143 is connected to a reference potential node, and the drain of the transistor 143 is connected to the gate of an N-channel transistor 124. The reference voltage V3 corresponds to the voltage of the drain of the transistor 143.

The first reference voltage output circuit section 106 outputs the reference voltage V3 for the normal mode, and receives the normal mode signal C1. The second reference voltage output circuit section 107 outputs the reference voltage V3 for the unblown fuse element test mode, and receives the unblown fuse element test mode signal C2. The third reference voltage output circuit section 108 outputs the reference voltage V3 for the blown fuse element test mode, and receives the blown fuse element test mode signal C3.

The first reference voltage output circuit section 106 includes transistors 131, 134, and 140 and a series connection circuit 137, including second electric fuse elements connected in series. The drain of the transistor 131, which is an N-channel transistor, is connected to the drain of the transistor 143, and the gate of the transistor 131 is connected to a node of the normal mode signal C1. The drain of the transistor 134, which is an N-channel transistor, is connected to the source of the transistor 131, and the gate of the transistor 134 is connected to a power supply voltage node. The gate of the transistor 140, which is an N-channel transistor, for example, is connected to the node of the normal mode signal C1, and the source of the transistor 140 is connected to a reference potential node. The series connection circuit 137, including the second electric fuse elements connected in series, is connected between the source of the transistor 134 and the drain of the transistor 140. The series connection circuit 137 includes, for example, ten unblown second electric fuse elements connected in series.

The second reference voltage output circuit section 107 includes transistors 132, 135, and 141 and a series connection circuit 138, including third electric fuse elements connected in series. The drain of the transistor 132, which is an N-channel transistor, is connected to the drain of the transistor 143, and the gate of the transistor 132 is connected to a node of the unblown fuse element test mode signal C2. The drain of the transistor 135, which is an N-channel transistor, is connected to the source of the transistor 132, and the gate of the transistor 135 is connected to a power supply voltage node. The gate of the transistor 141, which is an N-channel transistor, is connected to the node of the unblown fuse element test mode signal C2, and the source of the transistor 141 is connected to a reference potential node. The series connection circuit 138, including the third electric fuse elements connected in series, is connected between the source of the transistor 135 and the drain of the transistor 141. The series connection circuit 138 includes, for example, five unblown third electric fuse elements connected in series.

The third reference voltage output circuit section 108 includes transistors 133, 136, and 142 and a series connection circuit 139, including fourth electric fuse elements connected in series. The drain of the transistor 133, which is an N-channel transistor, is connected to the drain of the transistor 143, and the gate of the transistor 133 is connected to a node of the blown fuse element test mode signal C3. The drain of the transistor 136, which is an N-channel transistor, is connected to the source of the transistor 133, and the gate of the transistor 136 is connected to a power supply voltage node. The gate of the transistor 142, which is an N-channel transistor, is connected to the node of the blown fuse element test mode signal C3, and the source of the transistor 142 is connected to a reference potential node. The series connection circuit 139, including the fourth electric fuse elements connected in series, is connected between the source of the transistor 136 and the drain of the transistor 142. The series connection circuit 139 includes, for example, twenty unblown fourth electric fuse elements connected in series.

The electric fuse elements in the series connection circuits 137 to 139 have the same characteristics as those of the first electric fuse element 115.

The number of series connections in the series connection circuit 137, including the second electric fuse elements connected in series, is greater than the number of series connections in the series connection circuit 138, including the third electric fuse elements connected in series, and is smaller than the number of series connections in the series connection circuit 139, including the fourth electric fuse elements connected in series. That is, the resistance of the series connection circuit 137 is greater than the resistance of the series connection circuit 138 and is less than the resistance of the series connection circuit 139.

When the normal mode signal C1 is at a high level, the transistors 131 and 140 are turned on, and the transistors 132, 141, 133, and 142 are turned off. Thus, the reference voltage V3 corresponds to the resistance of the series connection circuit 137.

When the unblown fuse element test mode signal C2 is at a high level, the transistors 132 and 141 are turned on and the transistors 131, 140, 133, and 142 are turned off. Thus, the reference voltage V3 corresponds to the resistance of the series connection circuit 138.

When the blown fuse element test mode signal C3 is at a high level, the transistors 133 and 142 are turned on and the transistors 131, 140, 132, and 141 are turned off. Thus, the reference voltage V3 corresponds to the resistance of the series connection circuit 139.

That is, the reference voltage V3 for the normal mode (signal C1) is higher than the reference voltage V3 for the unblown fuse element test mode (signal C2) and is lower than the reference voltage V3 for the blown fuse element test mode (signal C3).

The selection circuit unit 102 selects one of the read voltages V1 of a plurality of read voltage output circuit units 101, and outputs the selected read voltage V1 as a read voltage V2.

The voltage comparison circuit unit 103 includes transistors 121 to 125. The voltage comparison circuit unit 103 compares the read voltage V2 with the reference voltage V3, and outputs a voltage V4, which represents a comparison result. The source of the transistor 121, which is a P-channel transistor, is connected to a power supply voltage node, and the gate of the transistor 121 is connected to the drain of the transistor 121. The source of the transistor 122, which is a P-channel transistor, is connected to a power supply voltage node, and the gate of the transistor 122 is connected to the gate of the transistor 121. The drain of the transistor 123, which is an N-channel transistor, is connected to the drain of the transistor 121, and the gate of the transistor 123 is connected to a node of the read voltage V2. The drain of the transistor 124, which is an N-channel transistor, is connected to the drain of the transistor 122, and the gate of the transistor 124 is connected to the drain of the transistor 143. The drain of the transistor 125, which is an N-channel transistor, is connected to the sources of the transistors 123 and 124, the gate of the transistor 125 is connected to a node of a voltage comparison control signal CMP, and the source of the transistor 125 is connected to a reference potential node. The voltage V4 is a voltage at a connection point between the drains of the transistors 122 and 124. When the voltage comparison control signal CMP is at a high level, voltage comparison is performed. When the read voltage V2 is higher than the reference voltage V3, the voltage V4 is at a high level. Meanwhile, when the read voltage V2 is lower than the reference voltage V3, the voltage V4 is at a low level. The latch circuit unit 105 latches the voltage V4, and outputs a voltage OUT.

First, an operation in a case where the normal mode signal C1 is at a high level will be explained. The first electric fuse element 115 is capable of storing data in accordance with whether the first electric fuse element 115 is in the blown state or the unblown state. When the resistance of the first electric fuse element 115 is smaller than a threshold resistance 403 (see FIG. 4), it is determined that the first electric fuse element 115 is in the unblown state. When the resistance of the first electric fuse element 115 is greater than the threshold resistance 403, it is determined that the first electric fuse element 115 is in the blown state. The read voltage V2 corresponds to the resistance of the first electric fuse element 115. The reference voltage V3 corresponds to the threshold resistance 403. When the read voltage V2 is lower than the reference voltage V3, the voltage comparison circuit unit 103 determines that the first electric fuse element 115 is in the unblown state. When the read voltage V2 is higher than the reference voltage V3, the voltage comparison circuit unit 103 determines that the first electric fuse element 115 is in the blown state. Accordingly, data of the first electric fuse element 115 can be read.

As described above, the first electric fuse element 115 in the unblown state has a resistance smaller than the threshold resistance 403 and the first electric fuse element 115 in the blown state has a resistance greater than the threshold resistance 403. To this end, a test for the resistance of the first electric fuse element 115 is carried out. A write circuit causes a current corresponding to data to flow in the first electric fuse element 115, and blowing or non-blowing processing is performed. By the time of testing, it is known whether the first electric fuse element 115 in each of the plurality of read voltage output circuit units 101 is in the blown state or the unblown state. In the case of a test for the first electric fuse element 115 in the unblown state, the unblown fuse element test mode signal C2 is set to a high level. Meanwhile, in the case of a test for the first electric fuse element 115 in the blown state, the blown fuse element test mode signal C3 is set to a high level.

Next, an operation in a case where the unblown fuse element test mode signal C2 is at a high level will be explained. The read voltage V2 corresponds to the resistance (distribution 401) of the first electric fuse element 115 in the unblown state. The reference voltage V3 corresponds to a threshold resistance 404. When the read voltage V2 is lower than the reference voltage V3, the voltage comparison circuit unit 103 determines that the test is successful. When the read voltage V2 is higher than the reference voltage V3, the voltage comparison circuit unit 103 determines that the test is not successful. As described above, in a case where the resistance of the first electric fuse element 115 in the unblown state falls within a resistance region 406 between the threshold resistances 403 and 404, it is determined that the test for the first electric fuse element 115 is unsuccessful. Thus, a sufficient reading margin can be ensured.

Next, an operation in a case where the blown fuse element test mode signal C3 is at a high level will be explained. The read voltage V2 corresponds to the resistance (distribution 402) of the first electric fuse element 115 in the blown state. The reference voltage V3 corresponds to a threshold resistance 405. When the read voltage V2 is higher than the reference voltage V3, the voltage comparison circuit unit 103 determines that the test is successful. When the read voltage V2 is lower than the reference voltage V3, the voltage comparison circuit unit 103 determines that the test is not successful. As described above, in a case where the resistance of the first electric fuse element 115 in the blown state falls within a resistance region 407 between the threshold resistances 403 and 405, it is determined that the test for the first electric fuse element 115 is unsuccessful. Thus, a sufficient reading margin can be ensured.

According to this variation, with the use of the reference voltage V3, which differs in accordance with the normal mode, the unblown fuse element test mode, or the blown fuse element test mode, a sufficient reading margin can be ensured. In addition, erroneous determination in the case of reading data of the first electric fuse element 115 can be avoided.

Second Variation

Figure 5:
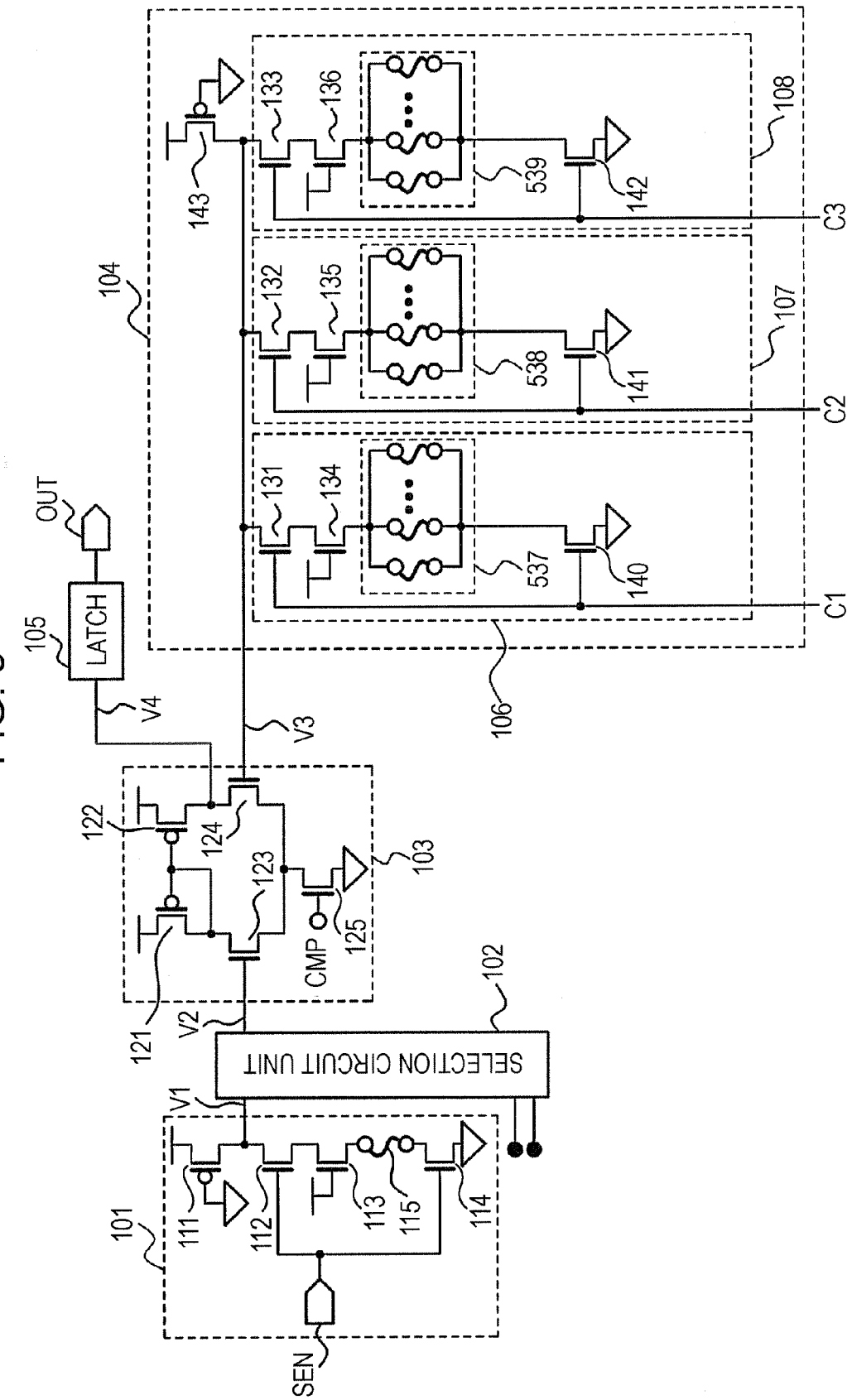
FIG. 5 illustrates an example of a fuse element reading circuit according to a second variation of the present invention.

FIG. 5 depicts an example of the configuration of a fuse element reading circuit according to a second variation of the present invention. This variation (see FIG. 5) is different from the first variation (see FIG. 1) in that the fuse element reading circuit according to this variation includes parallel connection circuits 537 to 539, instead of the series connection circuit 137 to 139. Hereinafter, differences between this variation and the first variation will be explained.

The parallel connection circuit 537 including second electric fuse elements connected in parallel is connected between the source of the transistor 134 and the drain of the transistor 140. The parallel connection circuit 537 includes, for example, ten blown second electric fuse elements connected in parallel.

The parallel connection circuit 538 including third electric fuse elements connected in parallel is connected between the source of the transistor 135 and the drain of the transistor 141. The parallel connection circuit 538 includes, for example, twenty blown third electric fuse elements connected in parallel.

The parallel connection circuit 539 including fourth electric fuse elements connected in parallel is connected between the source of the transistor 136 and the drain of the transistor 142. The parallel connection circuit 539 includes, for example, five blown fourth electric fuse elements connected in parallel.

When the normal mode signal C1 is at a high level, the reference voltage output circuit unit 104 outputs the reference voltage V3, corresponding to the resistance of the parallel connection circuit 537. When the unblown fuse element test mode signal C2 is at a high level, the reference voltage output circuit unit 104 outputs the reference voltage V3 corresponding to the resistance of the parallel connection circuit 538. When the blown fuse element test mode signal C3 is at a high level, the reference voltage output circuit unit 104 outputs the reference voltage V3 corresponding to the resistance of the parallel connection circuit 539.

The number of parallel connections in the parallel connection circuit 537, including the second electric fuse elements connected in parallel, is smaller than the number of parallel connections in the parallel connection circuit 538, including the third electric fuse elements connected in parallel, and is greater than the number of parallel connections in the parallel connection circuit 539, including the fourth electric fuse elements connected in parallel. That is, the resistance of the parallel connection circuit 537 is greater than the resistance of the parallel connection circuit 538 and is smaller than the resistance of the parallel connection circuit 539. Namely, the reference voltage V3 for the normal mode (signal C1) is higher than the reference voltage V3 for the unblown fuse element test mode (signal C2) and is lower than the reference voltage V3 for the blown fuse element test mode (signal C3).

In the first variation, by making the numbers of series connections of electric fuse elements in the series connection circuits 137 to 139 different from each other, the resistances of the series connection circuits 137 to 139 are made different from each other, and the reference voltage V3 is changed in accordance with the mode. In this variation, by making the numbers of parallel connections of electric fuse elements in the parallel connection circuits 537 to 539 different from each other, the resistances of the parallel connection circuits 537 to 539 are made different from each other and the reference voltage V3 is changed in accordance with the mode.

Third Variation

Figure 6:
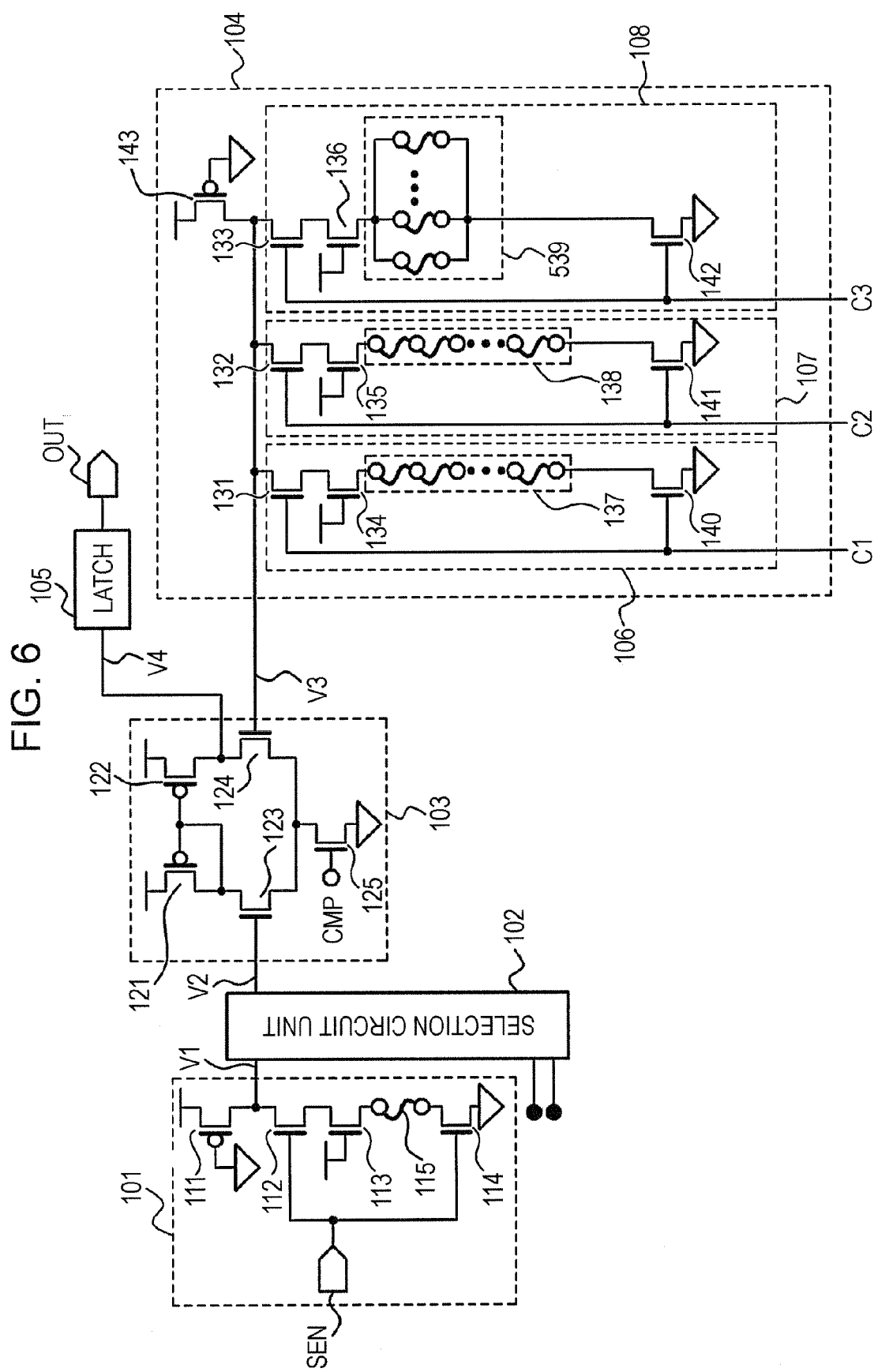
FIG. 6 illustrates an example of a fuse element reading circuit according to a third variation of the present invention.

FIG. 6 depicts an example of the configuration of a fuse element reading circuit according to a third variation of the present invention. This embodiment (see FIG. 6) is different from the first variation (see FIG. 1) in that the fuse element reading circuit according to this variation includes the parallel connection circuit 539 instead of the series connection circuit 139. Hereinafter, differences between this variation and the first variation will be explained.

As in the second variation (see FIG. 5), the parallel connection circuit 539, including the fourth electric fuse elements connected in parallel, is connected between the source of the transistor 136 and the drain of the transistor 142. The parallel connection circuit 539 includes, for example, five blown fourth electric fuse elements connected in parallel. When the blown fuse element test mode signal C3 is at a high level, the reference voltage output circuit unit 104 outputs the reference voltage V3 corresponding to the resistance of the parallel connection circuit 539.

The resistance of the series connection circuit 137 is greater than the resistance of the series connection circuit 138 and is smaller than the resistance of the parallel connection circuit 539. That is, the reference voltage V3 for the normal mode (signal C1) is higher than the reference voltage V3 for the unblown fuse element test mode (signal C2) and is lower than the reference voltage V3 for the blown fuse element test mode (signal C3).

In this variation, the reference voltage output circuit unit 104 includes the series connection circuits 137 and 138, in which electric fuse elements are connected in series and the parallel connection circuit 539, in which electric fuse elements are connected in parallel. The resistances of the circuits 137, 138 and 539 are made different from each other, and the reference voltage V3 is changed in accordance with the mode.

Fourth Variation

Figure 7:
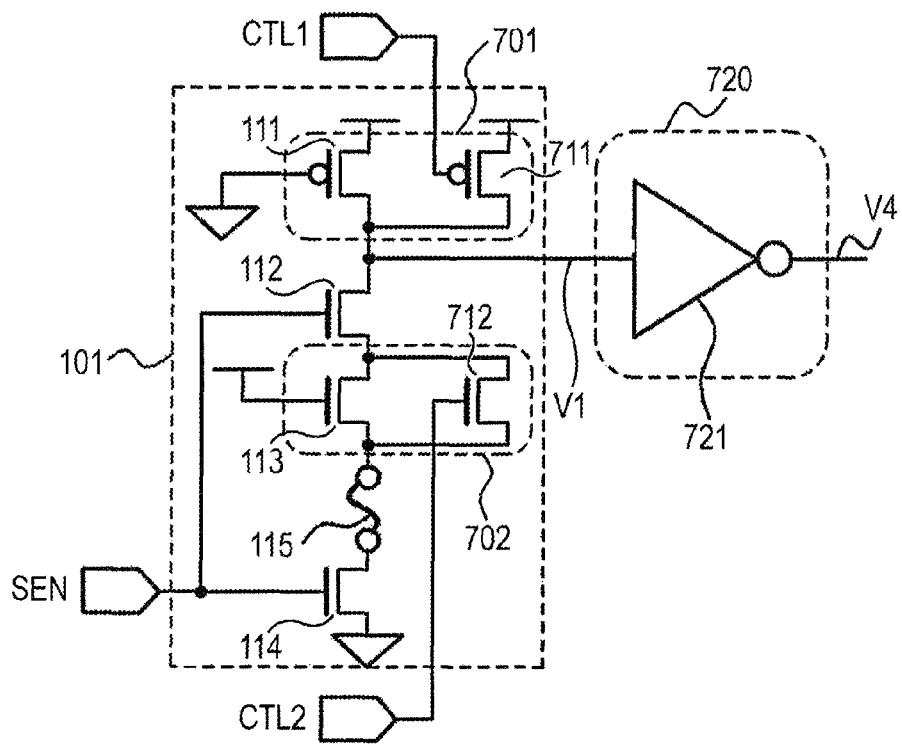
FIG. 7 illustrates an example of a fuse element reading circuit according to a fourth variation of the present invention.

FIG. 7 depicts an example of the configuration of a fuse element reading circuit according to a fourth variation of the present invention. Hereinafter, differences between this variation and the first variation will be explained. The fuse element reading circuit according to this variation includes the read voltage output circuit unit 101 and a logic circuit unit 720.

The read voltage output circuit unit 101 depicted in FIG. 7 is different from the read voltage output circuit unit 101 depicted in FIG. 1 in that the read voltage output circuit unit 101 depicted in FIG. 7 further includes transistors 711 and 712. The source of the transistor 711, which is a P-channel transistor, for example is connected to a power supply voltage node, the gate of the transistor 711 is connected to a first control node CTL1, and the drain of the transistor 711 is connected to the drain of the transistor 111. A parallel connection circuit 701 includes the transistors 111 and 711 connected in parallel. The drain of the transistor 712, which is an N-channel transistor, for example is connected to the drain of the transistor 113, the gate of the transistor 712 is connected to a second control node CTL2, and the source of the transistor 712 is connected to the source of the transistor 113. A parallel connection circuit 702 includes the transistors 113 and 712 connected in parallel.

In FIG. 7, the selection circuit unit 102 depicted in FIG. 1 is omitted. However, as in FIG. 1, the plurality of read voltage output circuit units 101 and the selection circuit unit 102 may be provided.

Figure 8:
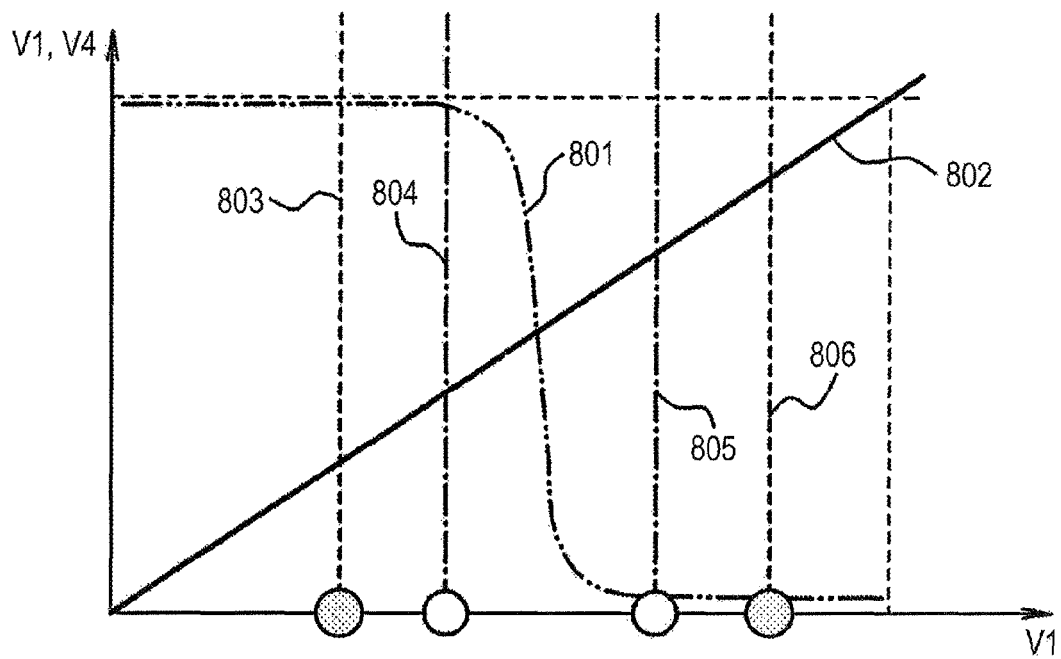
FIG. 8 illustrates an operation of a logic circuit unit, in accordance with an aspect of the present invention.

FIG. 8 illustrates an operation of an exemplary logic circuit unit 720. A characteristic 801 represents the relationship between an input voltage V1 and an output voltage V4 of the logic circuit unit 720. A voltage 802 represents the input voltage V1. The logic circuit unit 720 includes an inverter 721 and corresponds to the voltage comparison circuit unit 103 depicted in FIG. 1. The inverter 721 outputs the voltage V4 at a low level when the read voltage V1 is higher than a threshold voltage and outputs the voltage V4 at a high level when the read voltage V1 is lower than the threshold voltage, in accordance with the characteristic 801.

Figure 9:
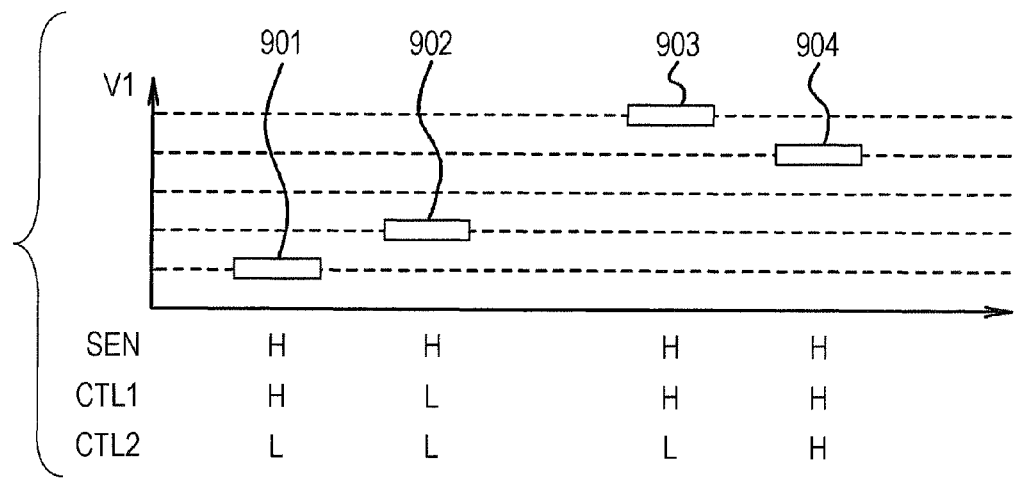
FIG. 9 illustrates the control voltages of control nodes, in accordance with an aspect of the present invention.

FIG. 9 depicts control voltages of the control nodes SEN, CTL1, and CTL2. As in the first variation, the normal mode, the unblown fuse element test mode, and the blown fuse element test mode are provided in this variation.

A voltage 901 represents the read voltage V1 of the first electric fuse element 115 in the unblown state in the normal mode. As in the first variation, the control node SEN is at a high level. The first control node CTL1 is at a high level, and the second control node CTL2 is at a low level. The transistor 711 is turned off, and the transistor 712 is turned off. The number of parallel connections in the parallel connection circuit 701 is reduced, the resistance of the parallel connection circuit 701 is increased, and the read voltage V1 drops. In addition, the number of parallel connections in the parallel connection circuit 702 is reduced, the resistance of the parallel connection circuit 702 is increased, and the read voltage V1 rises. In addition, the resistance of the first electric fuse element 115 in the unblown state is small. Hence, the read voltage V1 corresponds to the voltage 901, which is low. The voltage 901 corresponds to a voltage 803 in FIG. 8. The logic circuit unit 720 outputs the voltage V4 corresponding to the voltage V1, in accordance with the characteristic 801. The voltage V4 at a high level indicates that the first electric fuse element 115 stores data of an unblown fuse element.

A voltage 902 represents the read voltage V1 of the first electric fuse element 115 in the unblown state in the unblown fuse element test mode. As in the first variation, the control node SEN is at a high level. The first control node CTL1 is at a low level, and the second control node CTL2 is at a low level. The transistor 711 is turned on, and the transistor 712 is turned off. The number of parallel connections in the parallel connection circuit 701 is increased, the resistance of the parallel connection circuit 701 is reduced, and the read voltage V1 rises. In addition, the number of parallel connections in the parallel connection circuit 702 is reduced, the resistance of the parallel connection circuit 702 is increased, and the read voltage V1 rises. In addition, the resistance of the first electric fuse element 115 in the unblown state is small. Hence, the read voltage V1 corresponds to the voltage 902. The voltage 902 is slightly higher than the voltage 901 and corresponds to a voltage 804 in FIG. 8. The logic circuit unit 720 outputs the voltage V4 corresponding to the voltage V1, in accordance with the characteristic 801. When the voltage V4 is at a high level, the test is successful. Meanwhile, when the voltage V4 is at a low level, the test is not successful.

A voltage 903 represents the read voltage V1 of the first electric fuse element 115 in the blown state in the normal mode. As in the first variation, the control node SEN is at a high level. The first control node CTL1 is at a high level, and the second control node CTL2 is at a low level. The transistor 711 is turned off, and the transistor 712 is turned off. The number of parallel connections in the parallel connection circuit 701 is reduced, the resistance of the parallel connection circuit 701 is increased, and the read voltage V1 drops. In addition, the number of parallel connections in the parallel connection circuit 702 is reduced, the resistance of the parallel connection circuit 702 is increased, and the read voltage V1 rises. In addition, the resistance of the first electric fuse element 115 in the blown state is large. Hence, the read voltage V1 corresponds to the voltage 903, which is high. The voltage 903 corresponds to a voltage 806 in FIG. 8. The logic circuit unit 720 outputs the voltage V4 corresponding to the voltage V1, in accordance with the characteristic 801. The voltage V4 at a low level indicates that the first electric fuse element 115 stores data of a blown fuse element.

A voltage 904 represents the read voltage V1 of the first electric fuse element 115 in the blown state in the blown fuse element test mode. As in the first variation, the control node SEN is at a high level. The first control node CTL1 is at a high level, and the second control node CTL2 is at a high level. The transistor 711 is turned off, and the transistor 712 is turned on. The number of parallel connections in the parallel connection circuit 701 is reduced, the resistance of the parallel connection circuit 701 is increased, and the read voltage V1 drops. In addition, the number of parallel connections in the parallel connection circuit 702 is increased, the resistance of the parallel connection circuit 702 is reduced, and the read voltage V1 drops. In addition, the resistance of the first electric fuse element 115 in the blown state is large. Hence, the read voltage V1 corresponds to the voltage 904. The voltage 904 is slightly lower than the voltage 903, is higher than the voltage 902, and corresponds to a voltage 805 in FIG. 8. The logic circuit unit 720 outputs the voltage V4 corresponding to the voltage V1, in accordance with the characteristic 801. When the voltage V4 is at a low level, the test is successful. Meanwhile, when the voltage V4 is at a high level, the test is unsuccessful.

The read voltage V1 of the first electric fuse element 115 in the unblown state corresponds to the voltage 804 in the test mode. Even if the test is successful at a voltage that satisfies the minimum requirement, the read voltage V1 corresponds to the voltage 803 in the normal mode. Hence, a sufficient reading margin can be ensured.

Similarly, in the case of the first electric fuse element 115 in the blown state, the read voltage V1 corresponds to the voltage 805 in the test mode. Even if the test is successful at a voltage that satisfies the minimum requirement, the read voltage V1 corresponds to the voltage 806 in the normal mode. Hence, a sufficient reading margin can be ensured.

As described above, the first electric fuse element 115 has a resistance that differs in accordance with whether the first electric fuse element 115 is in the blown state or the unblown state. The parallel connection circuits 701 and 702 constitute a first resistor circuit. The first resistor circuit has a resistance which differs in accordance with the normal mode, the unblown fuse element test mode, or the blown fuse element test mode. By controlling the number of turned-on transistors that are connected in parallel, the resistance can be changed.

The parallel connection circuit 701 is a second resistor circuit, and the parallel connection circuit 702 is a third resistor circuit. The resistance of the parallel connection circuit 701 in the unblown fuse element test mode is smaller than the resistance of the parallel connection circuit 701 in each of the normal mode and the blown fuse element test mode. The resistance of the parallel connection circuit 702 in the blown fuse element test mode is smaller than the resistance of the parallel connection circuit 720 in each of the normal mode and the unblown fuse element test mode.

The number of turned-on transistors in the parallel connection circuit 701 in the unblown fuse element test mode is greater than the number of turned-on transistors in the parallel connection circuit 701 in each of the normal mode and the blown fuse element test mode. The number of turned-on transistors in the parallel connection circuit 702 in the blown fuse element test mode is greater than the number of turned-on transistors in the parallel connection circuit 702 in each of the normal mode and the unblown fuse element test mode.

The read voltage output circuit unit 101 outputs the read voltage V1 corresponding to the resistance of the first electric fuse element 115 and the resistances of the parallel connection circuits 701 and 702. The logic circuit unit 720 outputs the voltage V4 at a logic level corresponding to the read voltage V1 output from the read voltage output circuit unit 101.

Fifth Variation

Figure 10:
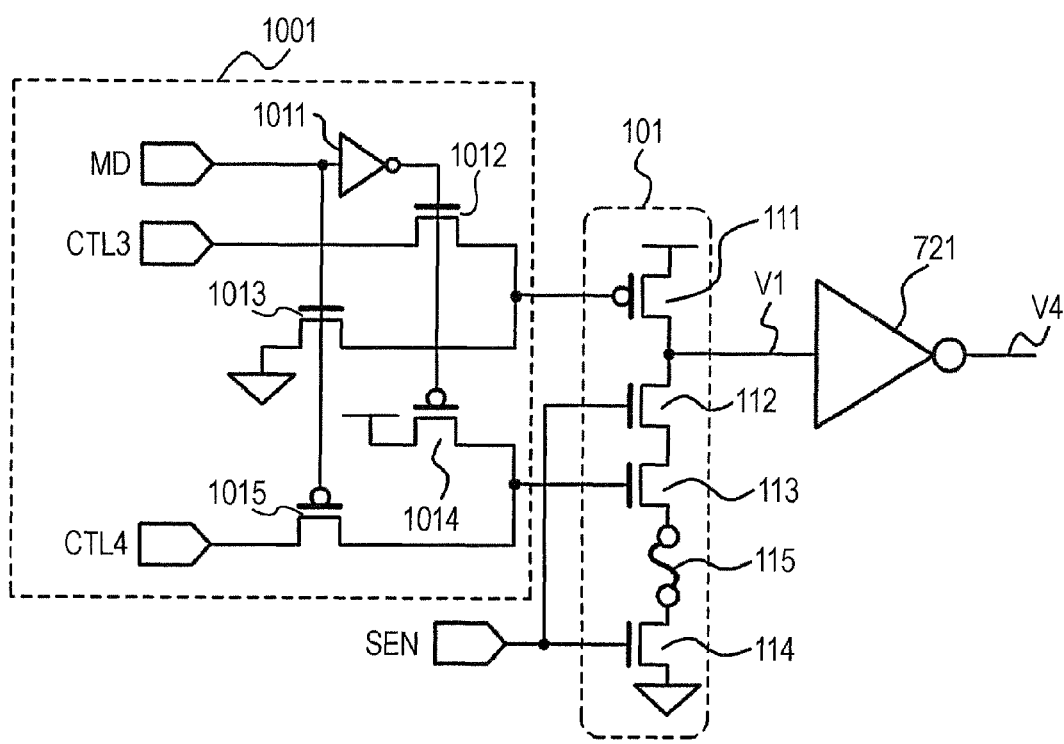
FIG. 10 illustrates an example of a fuse element reading circuit according to a fifth variation of the present invention.

FIG. 10 depicts an example of the configuration of a fuse element reading circuit according to a fifth variation of the present invention. Hereinafter, differences between this variation and the first variation will be explained. The fuse element reading circuit according to this variation includes the read voltage output circuit unit 101, the inverter (logic circuit) 721, and a control circuit unit 1001. The inverter 721 is the same as the inverter 721 in the fourth variation (see FIG. 7), and the same explanation of the inverter 721 in the fourth variation is applied to the inverter 721 in this variation.

The control circuit unit 1001 includes an inverter 1011 and transistors 1012 to 1015. The inverter 1011 logically inverts a signal from a mode node MD and outputs the logically inverted signal. The drain of the transistor 1012, which is an N-channel transistor, for example, is connected to a third control node CTL3, the gate of the transistor 1012 is connected to an output terminal of the inverter 1011, and the source of the transistor 1012 is connected to the gate of the transistor 111. The source of the transistor 1013, which is an N-channel transistor, for example is connected to a reference potential node, the gate of the transistor 1013 is connected to the mode node MD, and the drain of the transistor 1013 is connected to the gate of the transistor 111. The source of the transistor 1014, which is a P-channel transistor, for example is connected to a power supply voltage node, the gate of the transistor 1014 is connected to the output terminal of the inverter 1011, and the drain of the transistor 1014 is connected to the gate of the transistor 113. The source of the transistor 1015, which is a P-channel transistor, is connected to a fourth control node CTL4, the gate of the transistor 1015 is connected to the mode node MD, and the drain of the transistor 1015 is connected to the gate of the transistor 113.

Figure 11:
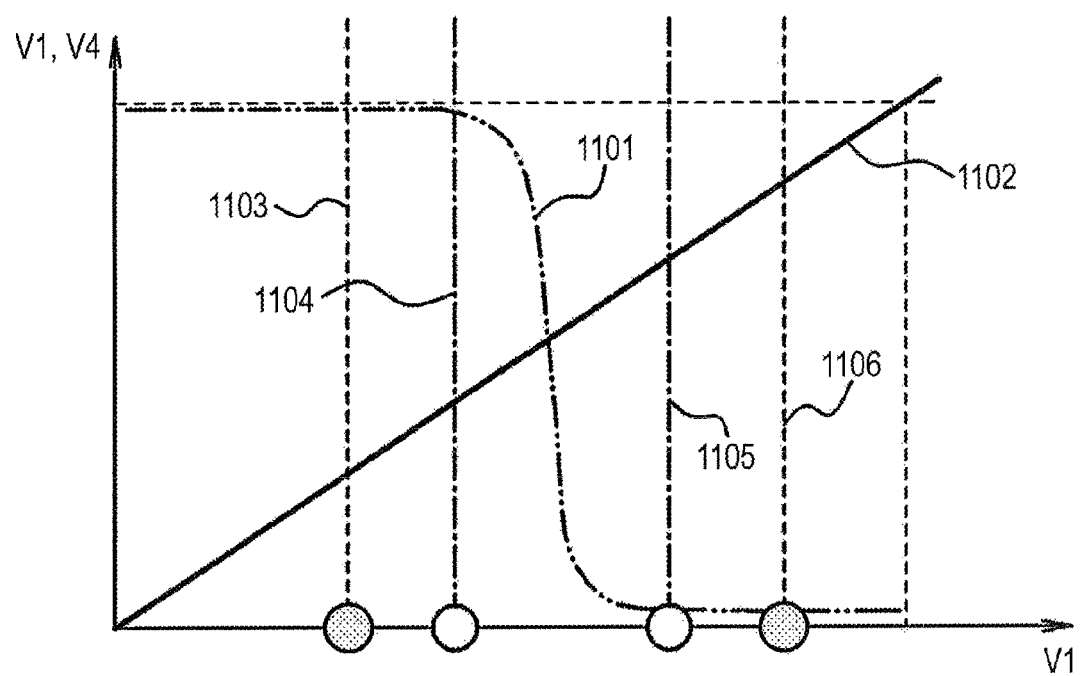
FIG. 11 illustrates an operation of an inverter, in accordance with an aspect of the present invention.

FIG. 11 illustrates an operation of the inverter 721. A characteristic 1101 represents the relationship between the input voltage V1 and the output voltage V4 of the inverter 721. A voltage 1102 represents the input voltage V1. The inverter 721 outputs the voltage V4 at a low level when the read voltage V1 is higher than a threshold voltage and outputs the voltage V4 at a high level when the read voltage V1 is lower than the threshold voltage, in accordance with the characteristic 1101.

First, a method for reading the first electric fuse element 115 in the unblown state in the normal mode will be explained. In the normal mode, the mode node MD and the control node SEN are at a high level. Thus, the transistors 1013, 1014, 112, and 114 are turned on, and the transistors 1012 and 1015 are turned off. Since the gate of the P-channel transistor 111 is at a reference potential (ground potential), the resistance is reduced and the read voltage V1 rises. The gate of the N-channel transistor 113 is at a power supply voltage, the resistance is reduced, and the read voltage V1 drops. In addition, the resistance of the first electric fuse element 115 in the unblown state is small. Hence, the read voltage V1 corresponds to the voltage 901, which is low (see FIG. 9). The voltage 901 corresponds to a voltage 1103 in FIG. 11. The inverter 721 outputs the voltage V4 corresponding to the voltage V1, in accordance with the characteristic

1101. The voltage V4 at a high level indicates that the first electric fuse element 115 stores data of an unblown fuse element.

Next, a method for reading the first electric fuse element 115 in the unblown state in the unblown fuse element test mode will be explained. In the unblown fuse element test mode, the mode node MD is at a low level, the control node SEN is at a high level, the third control node CTL3 is at a reference potential (ground potential), and the fourth control node CTL4 is at a voltage (for example, VDD×0.7 V) lower than a power supply voltage VDD. In a case where the power supply voltage VDD is 1 V, the fourth control node CTL4 is at 0.7 V. Thus, the transistors 1012, 1015, 112, and 114 are turned on, and the transistors 1013 and 1014 are turned off. Since the gate of the P-channel transistor 111 is at a reference potential, the resistance is reduced and the read voltage V1 rises. The gate of the N-channel transistor 113 is at, for example, VDD×0.7 V, the resistance is increased, and the read voltage V1 rises. In addition, the resistance of the first electric fuse element 115 in the unblown state is small. Hence, the read voltage V1 corresponds to the voltage 902 (see FIG. 9). The voltage 902 is slightly higher than the voltage 901 and corresponds to a voltage 1104 in FIG. 11. The inverter 721 outputs the voltage V4 corresponding to the voltage V1, in accordance with the characteristic 1101. When the voltage V4 is at a high level, the test is successful. Meanwhile, when the voltage V4 is at a low level, the test is not successful.

Next, a method for reading the first electric fuse element 115 in the blown state in the normal mode will be explained. In the normal mode, the mode node MD and the control node SEN are at a high level. Thus, the transistors 1013, 1014, 112, and 114 are turned on, and the transistors 1012 and 1015 are turned off. Since the gate of the P-channel transistor 111 is at a reference potential, the resistance is reduced and the read voltage V1 rises. The gate of the N-channel transistor 113 is at a power supply voltage, the resistance is reduced, and the read voltage V1 drops. In addition, the resistance of the first electric fuse element 115 in the blown state is large. Hence, the read voltage V1 corresponds to the voltage 903, which is high (see FIG. 9). The voltage 903 corresponds to a voltage 1106 in FIG. 11. The inverter 721 outputs the voltage V4 corresponding to the voltage V1, in accordance with the characteristic 1101. The voltage V4 at a low level indicates that the first electric fuse element 115 stores data of a blown fuse element.

Next, a method for reading the first electric fuse element 115 in the blown state in the blown fuse element test mode will be explained. In the blown fuse element test mode, the mode node MD is at a low level, the control node SEN is at a high level, the third control node CTL3 is at a voltage (for example, VDD×0.3 V) higher than a reference potential, and the fourth control node CTL4 is at a power supply voltage VDD. In a case where the power supply voltage VDD is 1 V, the third control node CTL3 is at 0.3 V. Thus, the transistors 1012, 1015, 112, and 114 are turned on, and the transistors 1013 and 1014 are turned off. Since the gate of the P-channel transistor 111 is at, for example, VDD×0.3 V, the resistance is increased and the read voltage V1 drops. The gate of the N-channel transistor 113 is at, for example, the power supply voltage VDD, the resistance is reduced, and the read voltage V1 drops. In addition, the resistance of the first electric fuse element 115 in the blown state is large. Hence, the read voltage V1 corresponds to the voltage 904 (see FIG. 9). The voltage 904 is slightly lower than the voltage 903, is higher than the voltage 902, and corresponds to a voltage 1105 in FIG. 11. The inverter 721 outputs the voltage V4 corresponding to the voltage V1, in accordance with the characteristic 1101. When the voltage V4 is at a low level, the test is successful. Meanwhile, when the voltage V4 is at a high level, the test is not successful.

The read voltage V1 of the first electric fuse element 115 in the unblown state corresponds to the voltage 1104 in the test mode. Even if the test is successful at a voltage that satisfies the minimum requirement, the read voltage V1 corresponds to the voltage 1103 in the normal mode. Hence, a sufficient reading margin can be ensured.

Similarly, in the case of the first electric fuse element 115 in the blown state, the read voltage V1 corresponds to the voltage 1105 in the test mode. Even if the test is successful at a voltage that satisfies the minimum requirement, the read voltage V1 corresponds to the voltage 1106 in the normal mode. Hence, a sufficient reading margin can be ensured.

As described above, the first electric fuse element 115 has a resistance that differs in accordance with whether the first electric fuse element 115 is in the blown state or the unblown state. The transistors 111 and 113 constitute a first resistor circuit. The first resistor circuit has a resistance which differs in accordance with the normal mode, the unblown fuse element test mode, or the blown fuse element test mode. By controlling the gate voltages of the transistors, the resistance can be changed.

The P-channel transistor 111 is a second resistor circuit, and the N-channel transistor 113 is a third resistor circuit. The resistance of the P-channel transistor 111 in each of the normal mode and the unblown fuse element test mode is smaller than the resistance of the P-channel transistor 111 in the blown fuse element test mode. The resistance of the N-channel transistor 113 in each of the normal mode and the blown fuse element test mode is smaller than the resistance of the N-channel transistor 113 in the unblown fuse element test mode.

The gate voltage of the P-channel transistor 111 in each of the normal mode and the unblown fuse element test mode is lower than the gate voltage of the P-channel transistor 111 in the blown fuse element test mode. The gate voltage of the N-channel transistor 113 in each of the normal mode and the blown fuse element test mode is higher than the gate voltage of the N-channel transistor 113 in the unblown fuse element test mode.

The read voltage output circuit unit 101 outputs the read voltage V1 corresponding to the resistance of the first electric fuse element 115 and the resistances of the transistors 111 and 113. The inverter (logic circuit) 721 outputs the voltage V4 at a logic level corresponding to the read voltage V1 output from the read voltage output circuit unit 101.

By setting stringent conditions for the unblown fuse element test mode and the blown fuse element test mode, compared with conditions for the normal mode as in the first to fifth variations, a sufficient reading margin can be ensured. In addition, erroneous determination in the case of reading data of a fuse element can be avoided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the variation(s) of the present inventions have been described in detail, it should be understood that the various changes, substitutions, and alterations could be made hereto without departing from the spirit and scope of the aspects of the invention described.

What is claimed is:

1. A fuse element reading circuit comprising:
   a first fuse element having a resistance that differs in accordance with whether the first fuse element is in a blown state or an unblown state;
   a reference voltage output circuit unit that outputs a reference voltage which differs in accordance with a normal mode or a test mode; and
   a voltage comparison circuit unit that compares a read voltage corresponding to the resistance of the first fuse element with the reference voltage output from the reference voltage output circuit unit;
   wherein the test mode is an unblown fuse element test mode or a blown fuse element test mode;
   wherein the reference voltage for the normal mode is higher than the reference voltage for the unblown fuse element test mode and is lower than the reference voltage for the blown fuse element test mode;
   wherein the reference voltage output circuit unit outputs a reference voltage corresponding to a resistance of a series connection circuit including unblown second fuse elements connected in series in the normal mode, outputs a reference voltage corresponding to a resistance of a series connection circuit including unblown third fuse elements connected in series in the unblown fuse element test mode, and outputs a reference voltage corresponding to a resistance of a series connection circuit including unblown fourth fuse elements connected in series in the blown fuse element test mode, and
   wherein the number of series connections in the series connection circuit, including the second fuse elements connected in series, is greater than the number of series connections in the series connection circuit, including the third fuse elements connected in series, and is smaller than the number of series connections in the series connection circuit, including the fourth fuse elements connected in series.

2. The fuse element reading circuit according to claim 1, wherein the reference voltage output circuit unit outputs a voltage corresponding to resistances of a plurality of second fuse elements.

3. A fuse element reading circuit comprising:
   a first fuse element having a resistance that differs in accordance with whether the first fuse element is in a blown state or an unblown state;
   a reference voltage output circuit unit that outputs a reference voltage which differs in accordance with a normal mode or a test mode; and
   a voltage comparison circuit unit that compares a read voltage corresponding to the resistance of the first fuse element with the reference voltage output from the reference voltage output circuit unit;
   wherein the test mode is an unblown fuse element test mode or a blown fuse element test mode;
   wherein the reference voltage for the normal mode is higher than the reference voltage for the unblown fuse element test mode and is lower than the reference voltage for the blown fuse element test mode; and
   wherein the reference voltage output circuit unit outputs a reference voltage corresponding to a resistance of a parallel connection circuit, including blown second fuse elements connected in parallel in the normal mode, outputs a reference voltage corresponding to a resistance of a parallel connection circuit, including blown third fuse elements connected in parallel in the unblown fuse element test mode, and outputs a reference voltage corresponding to a resistance of a parallel connection circuit, including blown fourth fuse elements connected in parallel in the blown fuse element test mode, and
   wherein the number of parallel connections in the parallel connection circuit, including the second fuse elements connected in parallel, is smaller than the number of parallel connections in the parallel connection circuit, including the third fuse elements connected in parallel, and is greater than the number of parallel connections in the parallel connection circuit, including the fourth fuse elements connected in parallel.

4. The fuse element reading circuit according to claim 3, wherein the reference voltage output circuit unit outputs a voltage corresponding to resistances of a plurality of second fuse elements.

5. A fuse element reading circuit comprising:
   a first fuse element having a resistance that differs in accordance with whether the first fuse element is in a blown state or an unblown state;
   a reference voltage output circuit unit that outputs a reference voltage which differs in accordance with a normal mode or a test mode; and
   a voltage comparison circuit unit that compares a read voltage corresponding to the resistance of the first fuse element with the reference voltage output from the reference voltage output circuit unit;
   wherein the test mode is an unblown fuse element test mode or a blown fuse element test mode;
   wherein the reference voltage for the normal mode is higher than the reference voltage for the unblown fuse element test mode and is lower than the reference voltage for the blown fuse element test mode; and
   wherein the reference voltage output circuit unit includes a plurality of unblown second fuse elements and a plurality of blown third fuse elements.

6. The fuse element reading circuit according to claim 5, wherein the reference voltage output circuit unit outputs a voltage corresponding to resistances of a plurality of second fuse elements.

* * * * *